United States Patent [19]
Yu

[11] Patent Number: 5,911,110
[45] Date of Patent: Jun. 8, 1999

[54] METHOD OF FORMING SHALLOW TRENCH ISOLATION WITH DUMMY PATTERN IN REVERSE TONE MASK

[75] Inventor: Chen-Hua Yu, Keelung, Taiwan

[73] Assignee: Taiwan Semiconductor Manufacturing Co., Ltd., Hsinchu, Taiwan

[21] Appl. No.: 08/959,024

[22] Filed: Oct. 28, 1997

[51] Int. Cl.[6] ............................................. H01L 21/76
[52] U.S. Cl. ......................... 438/424; 438/427; 438/692; 148/DIG. 50
[58] Field of Search ............................. 438/424, 427, 438/435, 437, 433, 692; 148/DIG. 50

[56] References Cited

U.S. PATENT DOCUMENTS 5,459,096  10/1995  Venkatesan et al. .................... 438/427
5,578,519  11/1996  Cho ........................................ 438/424
5,811,345   9/1998  Yu et al. ................................. 438/424

*Primary Examiner*—Trung Dang
*Attorney, Agent, or Firm*—Harness, Dickey & Pierce, P.L.C.

[57] ABSTRACT

A thin silicon dioxide layer and a silicon nitride layer are respectively formed on a wafer. A plurality of shallow trenches are formed in the wafer. A trench filling layer is successively refilled into the trenches for isolation. A reverse tone mask with a dummy pattern mask is patterned on top of the trench filling material. An etching is performed to etch the trench filling material using the reverse tone mask and the dummy pattern mask as etching masks. The reverse tone mask and the dummy pattern mask are then stripped away. A chemical mechanical polishing (CMP) technology is used to remove the trench filling layer to the surface of the silicon nitride layer for planarization.

16 Claims, 5 Drawing Sheets

METHOD OF FORMING SHALLOW TRENCH ISOLATION WITH DUMMY PATTERN IN REVERSE TONE MASK

FIELD OF THE INVENTION

The present invention relates to a method of isolation for an integrated circuit (IC) and, more specifically, to a method of forming a shallow trench isolation by using a dummy pattern during the formation of reverse tone structure.

BACKGROUND OF THE INVENTION

The advent of Ultra Large Scale Integrated (ULSI) circuits has allowed semiconductor manufacturers worldwide to fabricate semiconductor devices to extremely compact dimensions. The formation of electric circuits involves the fabrication of effective isolations between devices. Thus, to fabricate ICs, devices isolated from one another must first be formed in the silicon substrate. Establishing effective isolation in submicron ICs in the face of decreased isolation space is a complicated and challenging task.

Trench isolation is used primarily for isolating devices in VLSI and ULSI, and hence they can be considered as replacements for conventional LOCOS isolation. It is because of this that the LOCOS suffers many problems, such as "bird's beak" structure. The bird's beak shape causes unacceptably large encroachment of the field oxide into the device active regions. In addition, the planarity of the surface topography is inadequate for submicron lithography needs.

In basic shallow trench isolation (STI) technology, shallow trenches are anisotropically etched into the silicon substrate. A CVD oxide is deposited onto the substrate and is then planarized by CMP (Chemical Mechanical Polishing) or etching back. Another approach to shallow trench isolation is called a Buried Oxide with Etch-Stop process (BOXES). The process uses a silicon-nitride etch-stop layer and a pad layer formed on the substrate before the CVD-oxide is deposited.

As shown in FIG. 1, on a silicon substrate 1 a pad oxide 5 and a silicon nitride layer 7 are respectively formed on the substrate 1. Problems associated with the formation of shallow trench isolation include a dishing effect 3 of the wide trench, the erosion of nitride on a small area, and oxide 4 remaining on large silicon nitride area 6. The dishing effect degrades the planarity of a layer and impacts the control of implantation during the implantation process. Isolated devices are fabricated in the area denoted by 2, although silicon nitride may erode the area completely. This will damage the silicon substrate 1 and devices that are fabricated here. The oxide 4 that remains on the silicon nitride layer makes wet strip of silicon nitride unlikely.

One approach to solve the aforementioned problems is to form a "reverse tone" structure over the substrate. Turning to FIG. 2, a pad oxide layer 5 and a silicon nitride layer 7 are respectively formed on a silicon substrate 1. In order to overcome the aforementioned problems, a plurality of protruding portions of the silicon oxide 9 are generated over the trench region. This structure is referred to as "reverse tone". The protruded portions can eliminate the dishing problem due to the removing rate of the CMP performed over the trench being faster than the neighboring regions.

However, a problem arises when forming the reverse tone structure by etching. Typically, the reverse tone structure is etched by using a high density plasma (HDP) etcher such as, for example, the Omega HDP oxide etcher. The etching rate on large oxide areas is slower than that on small oxide areas. This is referred to as the so-called "reverse micro loading effect". Thus, a thicker oxide 11 remains on the surface of the large silicon nitride area 6 after the reverse tone structure is formed. After a chemical mechanical polishing is completed, the unacceptably severe SiN erosion problem persists and a significant amount of oxide remain on a large area.

SUMMARY OF THE INVENTION

A method is disclosed to fabricate a shallow trench isolation (STI). A thin silicon dioxide layer is formed on a wafer. Then, a silicon nitride layer is formed on the silicon dioxide layer. A plurality of shallow trenches are formed in the wafer. A trench filling layer is successively refilled into the trenches and formed on the silicon nitride layer for isolation. A reverse tone mask with a dummy pattern mask is patterned on the top of the trench filling material. The reverse tone mask is used to act a mask for forming reverse tone structure. The dummy pattern mask is patterned on the large oxide area to cover a first portion of the large oxide layer area and expose a second portion of the large oxide layer area. Therefore, the feature of the large oxide area is similar to the feature of the neighboring area due to the formation of the dummy pattern. An etching is performed to etch the trench filling material using the reverse tone mask and the dummy pattern mask as etching masks. The reverse tone mask 32 and the dummy pattern mask are then stripped away. Subsequently, a chemical mechanical polishing (CMP) technology is used to remove the trench filling layer to the surface of the silicon nitride layer for planarization.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to fabricate a shallow trench isolation (STI) by using a dummy pattern. The dummy pattern is used to avoid the reverse micro loading effect after etching for forming the reverse tone structure. The dummy pattern is formed on a large oxide area to reduce the influence caused by an etching rate difference. Thus, the etching rates of the large oxide area are similar to these of the small oxide area due to the dummy pattern structure. As described below, this technique can be used for manufacturing the shallow trench isolation.

Figure 1:
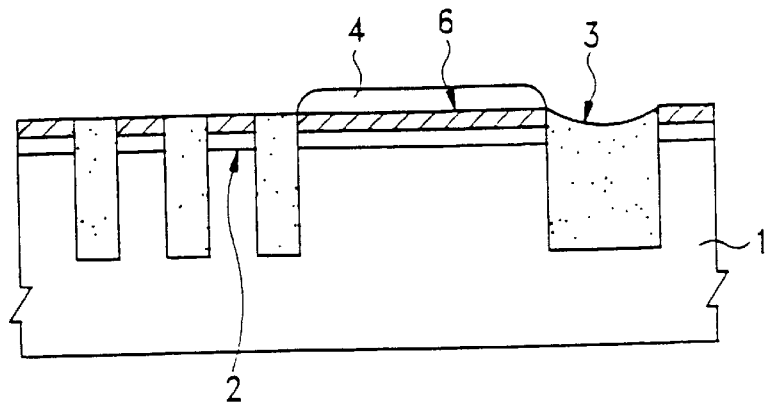
FIG. 1 is a cross-sectional view of a semiconductor wafer illustrating the dishing problem on a substrate in accordance with the prior art.
Figure 2:
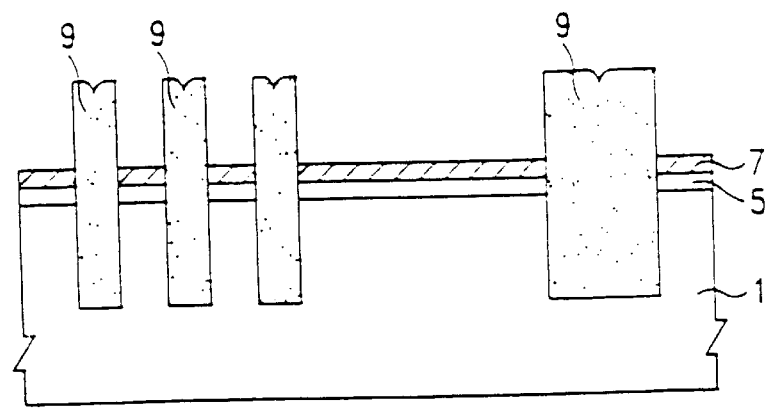
FIG. 2 is a cross-sectional view of a semiconductor wafer illustrating the "reverse tone" structure in accordance with the prior art.
Figure 3:
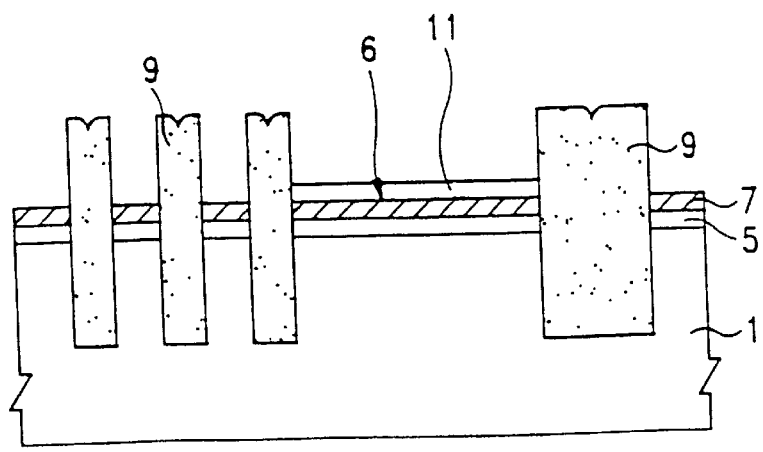
FIG. 3 is a cross-sectional view of a semiconductor wafer illustrating the reverse micro loading effect problem on a substrate in accordance with the prior art.
Figure 4:
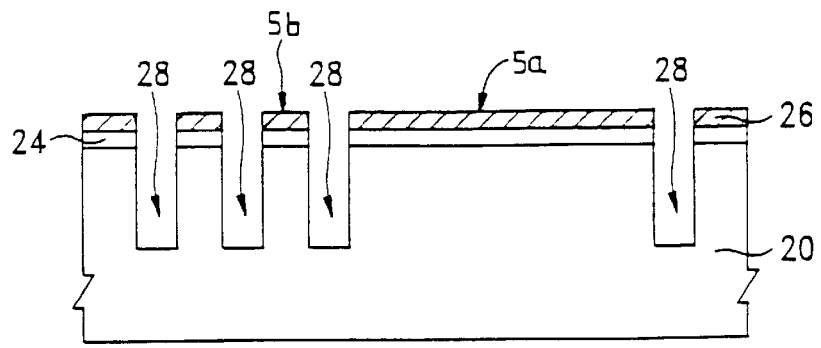
FIG. 4 is a cross-sectional view of a semiconductor wafer illustrating the step of forming a pad oxide, a silicon nitride layer and illustrating the step of forming a shallow trench in the substrate in accordance with the present invention.

Referring to FIG. 4, in the preferred embodiment, a semiconductor wafer, such as a silicon wafer 20 with <100>crystallographic orientation is provided. A thin silicon dioxide layer 24 is formed on the wafer 20 by thermal oxidation to act as a pad layer. The silicon dioxide layer 24 can be formed in an oxygen-steam ambient at a temperature of about 800° C. to 1100° C. The pad layer 24 is used as a cushion between the silicon wafer 20 and successive silicon nitride layer for reducing the stress between these two layers. The oxide layer 24 may be formed using any suitable chemical vapor deposition. In the instant case, the thickness of the silicon dioxide layer 24 is approximately 50–500 angstroms.

Subsequently, a silicon nitride layer 26 is deposited on the silicon dioxide layer 24 to serve as a stop layer for subsequent chemical mechanical polishing (CMP). The silicon nitride layer 26 can be deposited by any suitable process. As known by a person of ordinary skills in the art, the silicon nitride layer 26 can be formed using Low Pressure Chemical Vapor Deposition (LPCVD), Plasma Enhanced Chemical Vapor Deposition (PECVD), and High Density Plasma Chemical Vapor Deposition (HDPCVD). Typically, the reaction materials for the step are $SiH_4$, $NH_3$, $N_2$, $N_2O$ or $SiH_2Cl_2$, $NH_3$, $N_2$, $N_2O$. In this case, the thickness of the silicon nitride layer 26 is about 500 to 2000 angstroms. Further, the temperature forming the silicon nitride layer 26 is at a range of 400° C. to 800° C. Preferably, the temperature for the CVD is about 400° C. to 500° C. While the temperature is about 500° C. to 800° C. for LPCVD.

Successively, a plurality of shallow trenches 28 are formed in the wafer using lithography technology and an etching process. For example, a photoresist is patterned on the silicon nitride layer 26 to define the trench regions. The shallow trenches 28 are subsequently generated by using a dry etching technique. It is well known in the art that by controlling the recipe, the silicon nitride layer 26, the silicon dioxide layer 24 and the silicon wafer 20 can be respectively etched away. The photoresist is then stripped away after the trenches 28 are formed. In this case, after the trenches 28 are formed, the wafer 20 includes a first area 5a and a second area 5b formed between the trenches. The first area 5a is respectively large to the second area 5b.

Figure 5:
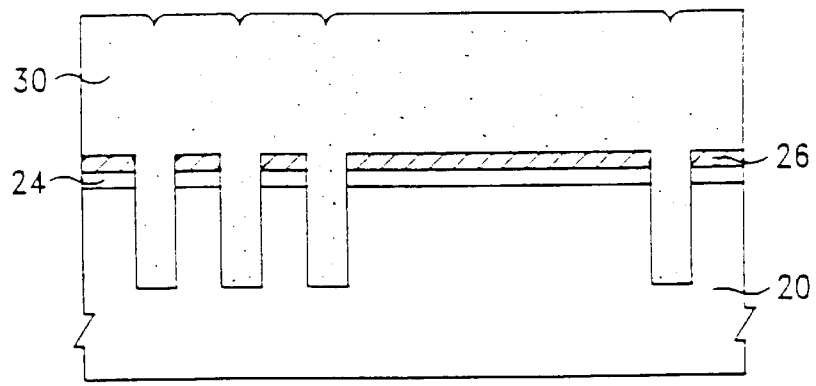
FIG. 5 is a cross-sectional view of a semiconductor wafer illustrating the step of forming an oxide layer in the shallow trench and on the silicon nitride layer in accordance with the present invention.

Turning next to FIG. 5, a trench filling layer 30 is successively refilled into the trenches 30 and formed on the silicon nitride layer 26 for isolation. Preferably, in order to provide effective isolation, silicon oxide is typically used to act as the trench filling material. Preferably, an ozone-TEOS layer is utilized to refill into the trench 28 as the isolation. Alternatively, plasma enhanced oxide or sub-atmospheric chemical vapor deposition oxide can also be used to act as the trench filling material. Preferably, the ozone-TEOS layer 30 is formed at a temperature in the range of about 400 to 480 centigrade degrees. Successively, a thermal process is carried out to density the trench filling layer 30 at a temperature about 950° C. to 1050° C. centigrade degrees for 30 to 130 minutes.

Figure 6:
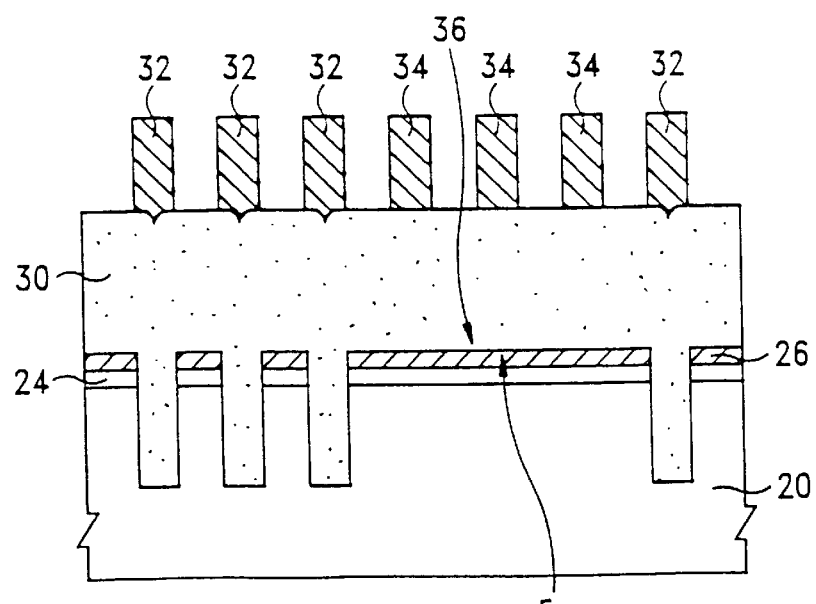
FIG. 6 is a cross-sectional view of a semiconductor wafer illustrating the step of forming a reverse tone mask and a dummy pattern mask in accordance with a first embodiment of the present invention.

Referring next to FIG. 6, a reverse tone mask 32 with a dummy pattern mask 34 is patterned on top of the trench filling layer 30. The reverse tone mask 32 is used to act as a mask for forming reverse tone structure. The reverse tone mask 32 is preferably aligned to the trench 28, thus a plurality of protruding oxide portions will be generated over the trench 28 after a subsequent etching. It should be noted that the reverse tone mask 32 does not have to align to the trench 28. The portion of the oxide that is formed on as large nitride area 5a is referred to a large oxide area 36. In a conventional method, the large oxide area 36 is exposed by the reverse tone mask 32. Conversely, in accordance with the present invention, the dummy pattern mask 34 is patterned on the large oxide area 36 to cover a first portion of the large oxide layer area 36 and expose a second portion of the large oxide layer area 36. Therefore, the feature of the large oxide area 36 is similar to the feature of the neighboring area due to the formation of the dummy pattern mask 34. Apparently, the etching rate of the large oxide area 36 will be the same with the neighboring area. Hence, the reverse micro loading effect is eliminated by the dummy pattern according to the present invention. After the etching step is completed, a plurality of protruding portions are at least formed over the large oxide layer area 36.

Figure 9A:
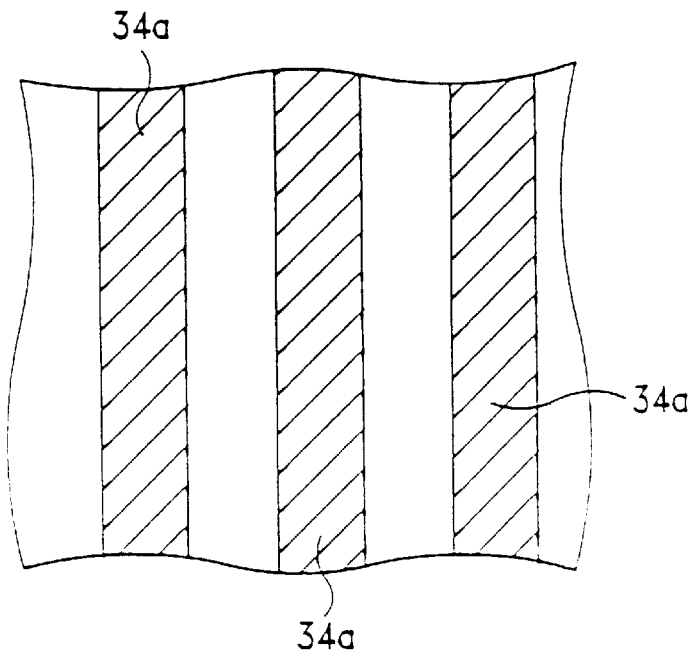
FIGS. 9A and 9B are the drawings showing the dummy pattern in accordance with the present invention.
Figure 9B:
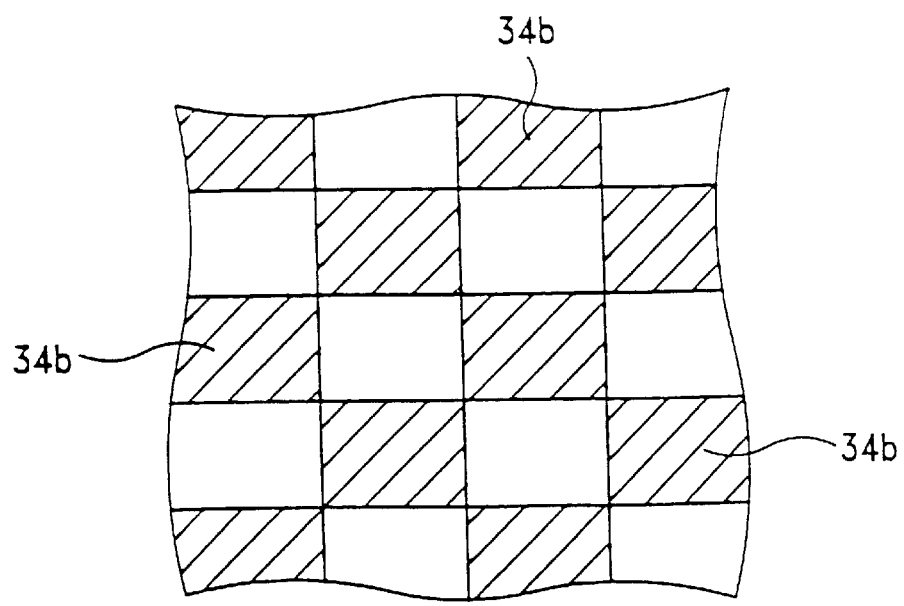

The configuration of the dummy pattern mask 34, for example, consists of a plurality of stripe structures 34a to cover the first portion of the large oxide area 36 as shown in FIG. 9A. Any suitable spacing between the stripe structures 34a can be used, depending on the process need. The width of the stripe structures 34a also depends on what the process requires, such as depending on the width of the trench and so on. Preferably, the width of the stripe structure 34a is close to the width of the trench. The dummy pattern mask 34 can be configured like a check board, as shown in FIG. 9B. A plurality of rectangular structures 34b formed on the large oxide area 36 to expose the second portion of the large oxide layer area 36. The width of the stripe structure 34a or the rectangular structure 34b is adjustable as are the spacings between the stripe structure 34a or the rectangular structure 34b.

Figure 6A:
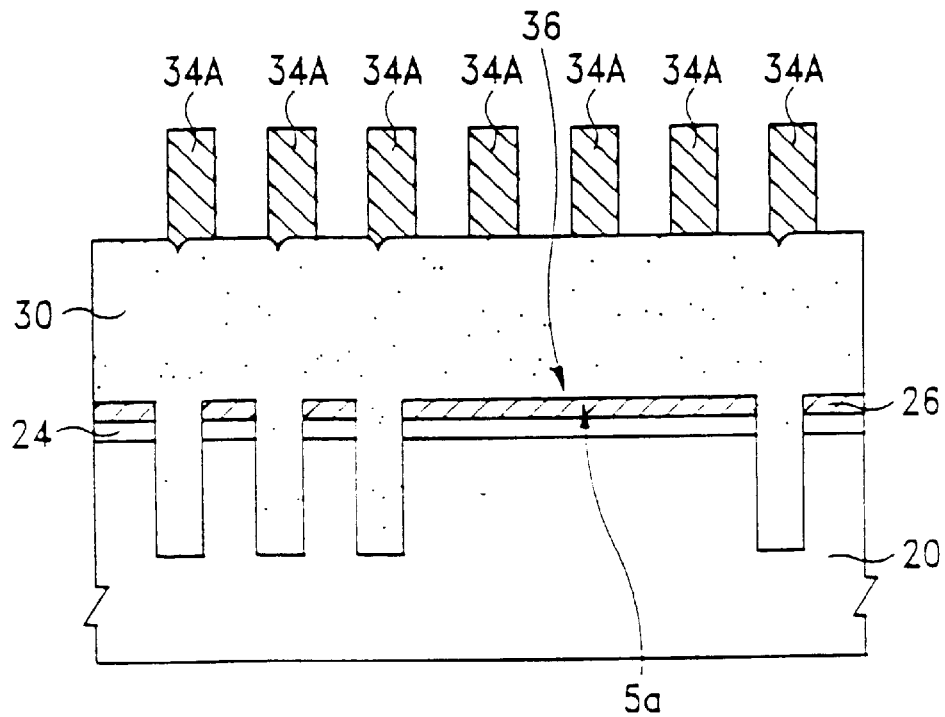
FIG. 6A is a cross-sectional view of a semiconductor wafer illustrating the step of forming a dummy pattern mask in accordance with a second embodiment of the present invention.

Alternatively, the reverse tone mask according to the present invention can be replaced by another dummy pattern mask to perform the same function. Namely, in a second embodiment, the present invention uses a dummy pattern formed over all of the wafer instead of forming the reverse tone structure with the dummy pattern. In detail, as shown in FIG. 6A, a dummy pattern 34A is formed on the trench filling layer 30 over all of the wafer 20. Portions of the dummy pattern 34A can be setestively aligned to the trenches or not. The configuration of the dummy pattern 34A is the same as the one of the first embodiment.

Figure 7A:
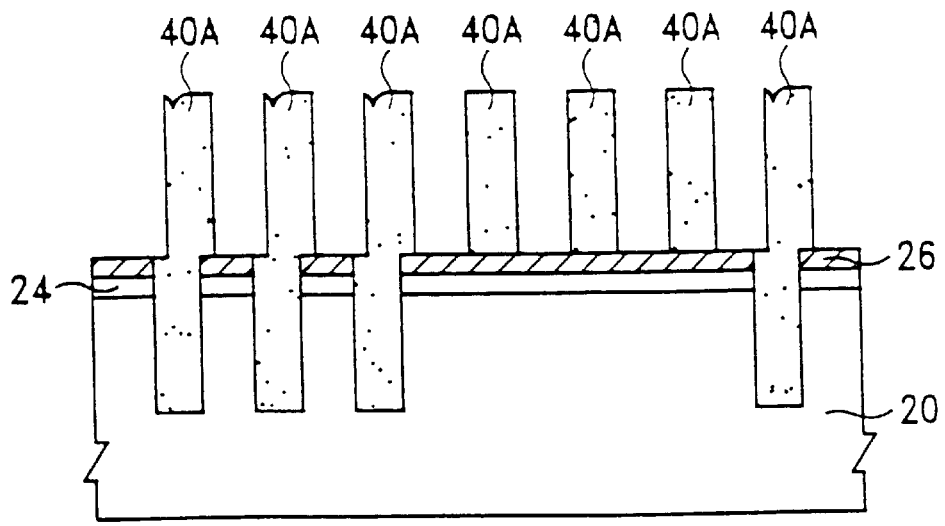
FIG. 7A is a cross-sectional view of a semiconductor wafer illustrating the step of forming a dummy pattern in accordance with the second embodiment of the present invention.
Figure 7:
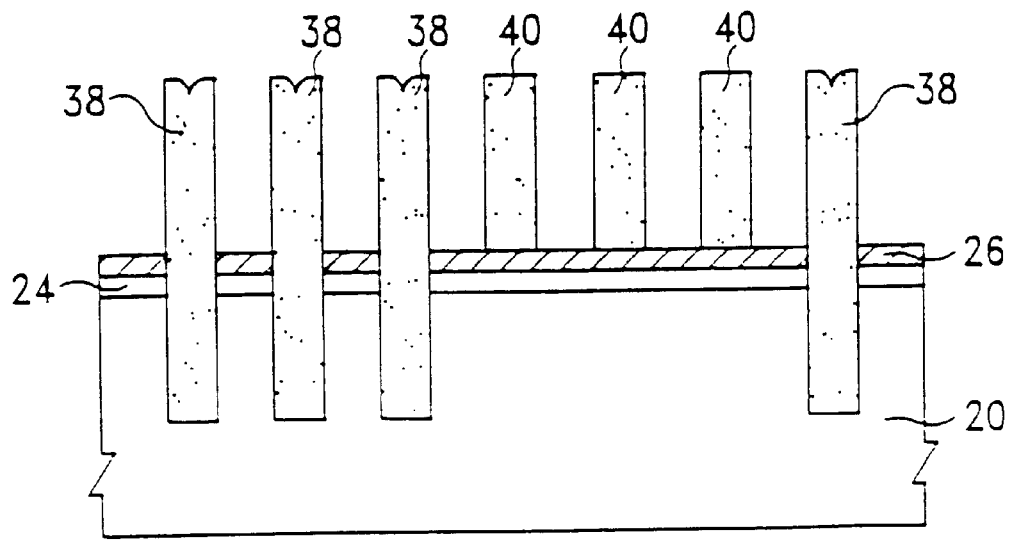
FIG. 7 is a cross-sectional view of a semiconductor wafer illustrating the step of forming a reverse tone and a dummy pattern in accordance with the first embodiment of the present invention.
Figure 8:
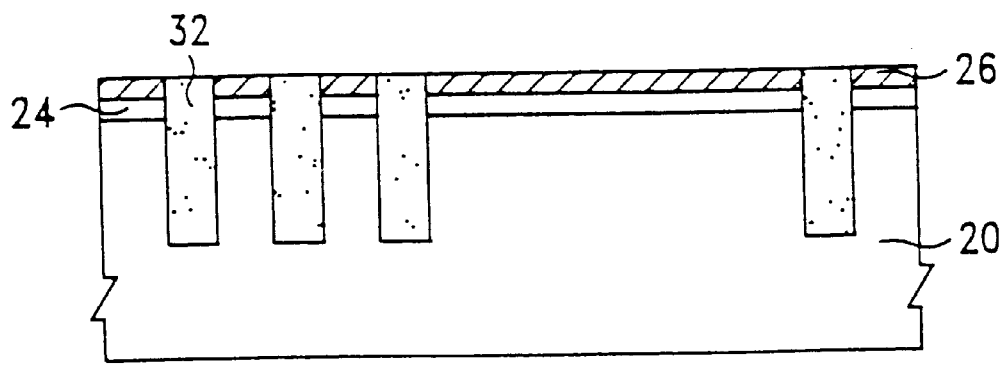
FIG. 8 is a cross-sectional view of a semiconductor wafer illustrating the step of performing a chemical mechanical polishing to the oxide layer in accordance with the present invention.

Referring to FIG. 7, an etching step is performed to etch the trench filling layer 30 using the reverse tone mask 32 and the dummy pattern mask 34 as etching masks in accordance with the first embodiment. In the second embodiment, the dummy pattern 34A is used as an etching mask, as shown in FIG. 7A. In the preferred embodiment, a plasma etch is used to achieve this purpose. In prior art, the reverse micro loading effect occurs due to the difference of the etching rate. This problem will be eliminated in the present invention. Therefore, a plurality of protruding reverse tone 38 remains over the trench 28. Further, a plurality of protruding dummy pattern 40 remains on the large oxide area 36. The reverse tone mask 32 and the dummy pattern mask 34 are then stripped away. Similarly, in the second embodiment, a plurality of dummy 40A is generated over the silicon nitride layer 26. Referring to FIG. 8, subsequently, a chemical mechanical polishing (CMP) technology is used to remove the trench filling layer 32 to the surface of the silicon nitride layer 26 for planarization.

The silicon nitride layer 26 and the pad oxide layer 24 are respectively removed thereafter. CMP can be used, or, other conventional methods may be used. For example, the silicon nitride layer 26 and 4 are removed by using dry-etch.

As is understood by a person skilled in the art, the foregoing preferred embodiment of the present invention is illustrative of the present invention rather than limiting of the present invention. For example, the present invention uses the dummy pattern on the large oxide area. Any suitable configuration of the dummy pattern can be used to eliminate the reverse micro loading effect. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a trench isolation on a silicon wafer, said method comprising the following steps of:

forming a pad layer on said silicon wafer;

forming a silicon nitride layer over said pad layer;

forming a plurality of trenches in said silicon wafer by etching said silicon nitride layer, said pad layer and said silicon wafer, after said plurality of trenches are formed, said silicon wafer including a first area not including said plurality of trenches, and a second area including said plurality of trenches;

forming a trench filling layer for isolation on said silicon nitride layer and filling into said plurality of trenches; and patterning said trench filling layer to form a dummy pattern including a plurality of protruding portions on at least a portion of said first area.

2. The method of claim 1 further comprising the step of:
   after the step of patterning said trench filling layer, planarizing said trench filling layer by using chemical mechanical polishing.

3. The method of claim 1 further comprising the step of:
   after the step of forming said trench filling layer, performing a thermal annealing for densification.

4. The method of claim 2 further comprising the step of:
   after the step of forming said trench filling layer, performing a thermal annealing for densification.

5. The method of claim 1, wherein the step of forming said plurality of trenches comprises:

patterning a photoresist on said silicon nitride layer to define a plurality of trench regions;

etching said silicon nitride layer, said pad layer and said silicon wafer by using said photoresist as a mask; and removing said photoresist.

6. The method of claim 1, wherein said dummy pattern covers a first portion of said trench filling layer and exposes a second portion of said trench filling layer, a width of said first portion being close to a width of said trench.

7. The method of claim 1, wherein said trench filling layer is selected from the group consisting of PE-oxide (plasma enhanced oxide) layer, SACVD-oxide (sub-atmospheric chemical vapor deposition oxide) layer and ozone-TEOS layer.

8. The method of claim 6, wherein said ozone-TEOS layer is formed at a temperature in the range of about 400 to 480° C.

9. The method of claim 1, wherein said silicon nitride layer is formed by a method selected from the group consisting of Low Pressure Chemical Vapor Deposition (LPCVD), Plasma Enhanced Chemical Vapor Deposition (PECVD) and High Density Plasma Chemical Vapor Deposition (HDPCVD).

10. The method of claim 9, wherein the reaction gases of forming said silicon nitride layer comprises $SiH_4$, $NH_3$, $N_2$, $N_2O$.

11. The method of claim 9, wherein the reaction gases of forming said silicon nitride layer comprises $SiH_2Cl_2$, $NH_3$, $N_2$, $N_2O$.

12. The method of claim 9, wherein the temperature of forming said silicon nitride layer is about 400–800° C.

13. The method of claim 3, wherein said thermal annealing is carried out at a temperature of about 950 to 1050° C.

14. The method of claim 13, wherein said thermal annealing is carried out for about 30 to 130 minutes.

15. The method of claim 4, wherein said thermal annealing is carried out at a temperature of about 950 to 1050° C.

16. The method of claim 15, wherein said thermal annealing is carried for out about 30 to 130 minutes.

* * * * *